(12) United States Patent
Järvelä et al.

(10) Patent No.: US 11,075,538 B2
(45) Date of Patent: Jul. 27, 2021

(54) SYSTEM AND A METHOD FOR INDICATING INFORMATION REPRESENTING BATTERY STATUS OF AN ELECTRONIC DEVICE

(71) Applicant: Oura Health Oy, Oulu (FI)

(72) Inventors: Petteri Järvelä, Oulu (FI); Tero Vallius, Oulu (FI); Markku Koskela, Oulu (FI); Markku Kallunki, Oulu (FI); Timo Voutilainen, Oulu (FI); Sami Pelkonen, Oulu (FI)

(73) Assignee: Oura Health Oy, Oulu (FI)

( * ) Notice: Subject to any disclaimer, the term of this patent is extended or adjusted under 35 U.S.C. 154(b) by 268 days.

(21) Appl. No.: 16/396,984

(22) Filed: Apr. 29, 2019

(65) Prior Publication Data

US 2019/0341798 A1 Nov. 7, 2019

(30) Foreign Application Priority Data

May 7, 2018 (FI) .................................... 20185418

(51) Int. Cl.
*H02J 7/02* (2016.01)
*H02J 50/80* (2016.01)
(Continued)

(52) U.S. Cl.
CPC ............ *H02J 7/025* (2013.01); *G01R 31/382* (2019.01); *G06F 1/163* (2013.01); *H01M 10/425* (2013.01);
(Continued)

(58) Field of Classification Search
USPC ........................................................ 320/108
See application file for complete search history.

(56) References Cited

U.S. PATENT DOCUMENTS

| 6,014,011 A | 1/2000 | DeFelice et al. |
| 7,211,986 B1 | 5/2007 | Flowerdew et al. |

(Continued)

FOREIGN PATENT DOCUMENTS

| EP | 2725682 A1 | 4/2014 |
| EP | 3043485 A1 | 7/2016 |

OTHER PUBLICATIONS

Finnish Patent and Registration Office, Search Report issued on FI20185418, dated Dec. 7, 2018, 2 pages.
(Continued)

*Primary Examiner* — Mohammed Alam
(74) *Attorney, Agent, or Firm* — Holland & Hart LLP

(57) ABSTRACT

The invention relates to a system for indicating information representing battery status of an electronic device. The system comprises a charging unit and an electronic device. The charging unit comprises: charging means; wireless communication means; and indication means. The electronic device comprises a rechargeable battery; charging means; and wireless communication means. During the wireless charging of the electronic device the electronic device is configured to detect information representing the battery status of said electronic device and to communicate the detected information representing the battery status to the charging unit, and the charging unit is configured to receive the information from the electronic device and to indicate at least part of the received information representing the battery status of the electronic device. The invention relates also to a method for indicating information representing battery status of an electronic device.

6 Claims, 4 Drawing Sheets

(51) Int. Cl.
*H02J 50/10* (2016.01)
*G01R 31/382* (2019.01)
*G06F 1/16* (2006.01)
*H01M 10/42* (2006.01)
*H02J 7/00* (2006.01)

(52) U.S. Cl.
CPC ............ *H02J 7/0047* (2013.01); *H02J 50/10* (2016.02); *H02J 50/80* (2016.02); *H01M 2010/4278* (2013.01)

(56) References Cited

U.S. PATENT DOCUMENTS

| | | | |
|---|---|---|---|
| 2008/0211458 A1 | 9/2008 | Lawther et al. | |
| 2014/0275884 A1 | 9/2014 | Lin | |
| 2017/0284865 A1 | 10/2017 | Metrani | |
| 2017/0321853 A1* | 11/2017 | Chien | G03B 23/00 |
| 2018/0062422 A1* | 3/2018 | Kim | H02J 7/025 |
| 2019/0238002 A1* | 8/2019 | Lee | H02J 50/10 |
| 2019/0341798 A1* | 11/2019 | Jarvela | H02J 7/0047 |
| 2020/0035082 A1* | 1/2020 | Lee | G01R 31/382 |
| 2020/0185942 A1* | 6/2020 | Hauschultz | G06F 1/28 |
| 2020/0203980 A1* | 6/2020 | Lee | H04W 72/082 |

OTHER PUBLICATIONS

European Patent Office, search report of European patent application No. EP19172451, search completed Jul. 22, 2019, 2 pages.

* cited by examiner

SYSTEM AND A METHOD FOR INDICATING INFORMATION REPRESENTING BATTERY STATUS OF AN ELECTRONIC DEVICE

PRIORITY

This application claims priority of Finnish patent application number FI21085418 which was filed on 7 May 2018, the contents of which are incorporated herein by reference.

TECHNICAL FIELD

The invention concerns in general the technical field of battery operated electronic devices. Especially the invention concerns systems comprising a battery operated electronic device and a charging unit for the electronic device.

BACKGROUND

Typically, wearable electronic devices, such as smartwatches or smart rings, are using rechargeable battery as an energy source. When the battery is running low, i.e. its energy is used, it needs to be charged, typically with a charger. The battery may be connected with electrical contacts to the charger or the charging may be wireless. In the wireless charging the charger comprises a transmitting coil to transmit electromagnetic power to the receiving coil which is integrated or embedded in the chargeable wearable device. The received electromagnetic power may be then be transformed and filtered into electric current to charge the battery of the wearable device. Many wearable devices comprise a display or some kind of indicator for indicating the status of the charging of the wearable device. Simply, the indicator may indicate that the battery is fully charged or it may indicate also fractional levels of charged status, such as ¼-½ or ¾ charged. The indication may also be percentage of charged status, for example 75%.

Some wearable devices are small and have no indicator or display for indicating the charging status.

Some wearable devices may comprise a wireless connection to a mobile device and a mobile application running in the mobile device. The wearable device may communicate the charging information to the mobile device and the mobile application may show the charging status as described above. The use of mobile device for indicating the charging status is not user friendly as there is need to keep a mobile device available and the mobile application running.

According to one prior art solution the charging status may be detected from the charging current in the charger. However, the drawback of this solution is that in small and very low power devices, the battery and the receiving coil of the device are small, and thus the corresponding charging current is also very low. It is very challenging to detect the charging status from the charging current in the charger, if the charging current is very low. Hence, this prior art solution is suitable only for larger devices and batteries having larger charging currents.

SUMMARY

The following presents a simplified summary in order to provide basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

An objective of the invention is to present a system and a method for indicating information representing battery status of an electronic device. Another objective of the invention is that the system and the method for indicating information representing battery status of an electronic device enable that the battery status of an electronic device, which does not have any indicator to indicate its battery status, may be indicated during the charging.

The objectives of the invention are reached by a system and a method as defined by the respective independent claims.

According to a first aspect, a system for indicating information representing battery status of an electronic device is provided, wherein the system comprises: a charging unit comprising: charging means for wireless charging; wireless communication means for communication with the electronic device; and indication means for indicating information representing the battery status of the electronic device, and the electronic device without means for indicating information representing the battery status of said electronic device, the electronic device comprising: a rechargeable battery; charging means for wireless charging; and wireless communication means for communication with the charging unit, wherein, during the wireless charging of the electronic device: the electronic device is configured to detect information representing the battery status of said electronic device and to communicate the detected information representing the battery status to the charging unit, and the charging unit is configured to receive the information representing the battery status from the electronic device and to indicate at least part of the received information representing the battery status of the electronic device.

The wireless communication means of the electronic device may comprise an infrared, IR, transmitter and the wireless communication means of the charging unit may comprise IR receiver in order to communicate the information representing the battery status from the electronic device to the charging unit.

The IR transmitter of the electronic device may be an infrared LED, IRLED, used for optical sensing purposes, when the electronic device is not charging.

Alternatively, the wireless communication means of the electronic device may comprise Bluetooth, BT, radio communication unit or Bluetooth Low Energy, BTLE, radio communication unit and the wireless communication means of the charging unit may comprise BT receiver or BTLE receiver in order to communicating the information representing the battery status from the electronic device to the charging unit.

The electronic device may be a wearable electronic device.

The indication means of the charging unit may comprise at least one of the following: one or more LED indicators, display.

The information representing the battery status may comprise at least one of the following: current charging status of the battery, estimation of required charging time for full charge.

Furthermore, the charging unit may further be configured to recognize the electronic device under wireless charging by one of the following: pairing or information based on the received information representing the battery status.

According to a second aspect, a method for indicating information representing battery status of an electronic device is provided, wherein the method comprises: arranging the electronic device to a charging unit, wirelessly transmitting power from the charging unit to the electronic device in order to charge the battery of the electronic device, detecting information representing the battery status by the electronic device, communicating the detected information representing the battery status from the electronic device to the charging unit, and indicating the at least part of the received information representing the battery status by means of the indicator of the charging unit.

Various exemplifying and non-limiting embodiments of the invention both as to constructions and to methods of operation, together with additional objects and advantages thereof, will be best understood from the following description of specific exemplifying and non-limiting embodiments when read in connection with the accompanying drawings.

The verbs "to comprise" and "to include" are used in this document as open limitations that neither exclude nor require the existence of unrecited features. The features recited in dependent claims are mutually freely combinable unless otherwise explicitly stated. Furthermore, it is to be understood that the use of "a" or "an", i.e. a singular form, throughout this document does not exclude a plurality.

BRIEF DESCRIPTION OF FIGURES

The embodiments of the invention are illustrated by way of example, and not by way of limitation, in the figures of the accompanying drawings.

DESCRIPTION OF THE EXEMPLIFYING EMBODIMENTS

Figure 1:
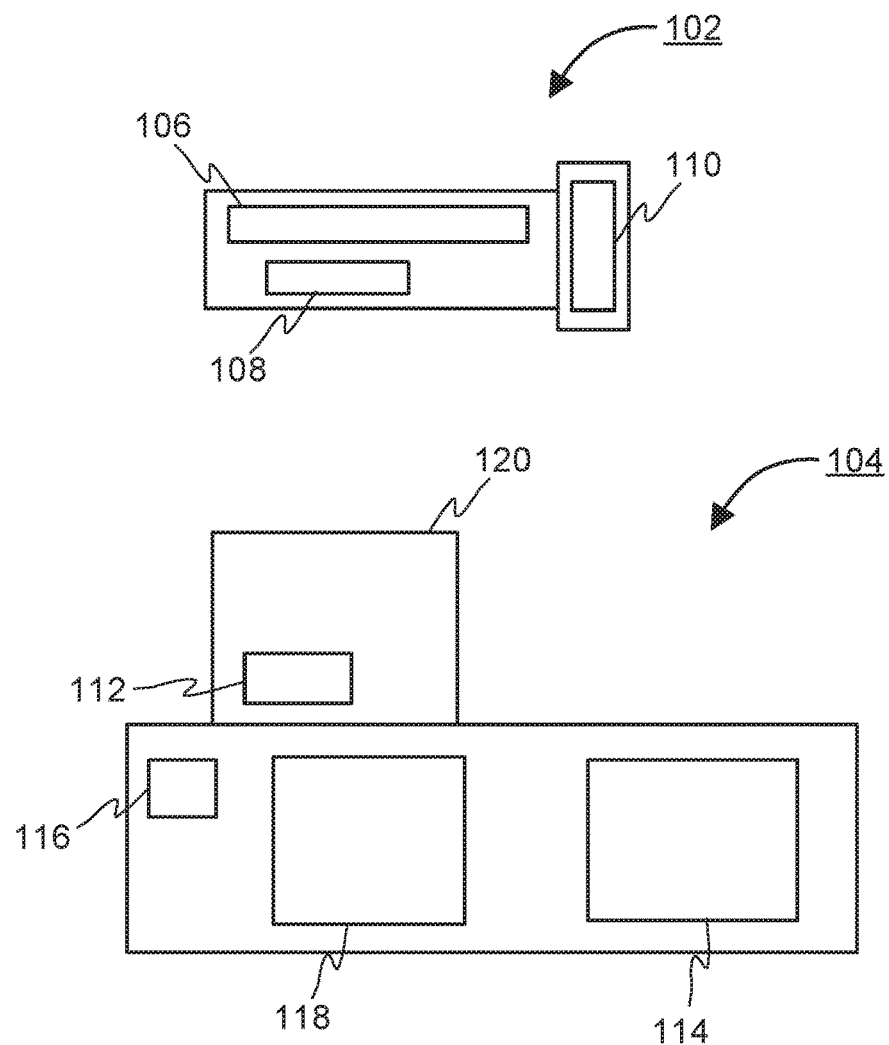
FIG. 1 illustrates schematically an example of a system according to the invention.

FIG. 1 illustrates schematically an example of a system according to the invention. The system comprises at least one electronic device 102 and a charging unit 104. The at least one electronic device 102 may be a wearable electronic device that is capable for monitoring, e.g. activity, sleep, heart rate, and/or recovery of the user. Some non-limiting examples of the wearable electronic device may be, e.g. a smart ring, a smartwatch, a smart garment, etc. In the example illustrated in FIG. 1, the electronic device 102 is a smart ring.

The electronic device 102 may comprise an energy storage 106, e.g. a rechargeable battery, a receiving coil 108 for wireless charging, and other electronic device related units 110. The receiving coil 108 may be integrated to or embedded in the electronic device 102. The other device related units 110 of the electronic device may comprise e.g. a microcontroller; one or more sensors; and/or wireless communication means, e.g. one or more transmitters and one or more receivers, for wireless communication with other wireless devices, e.g. with the charging unit 104. The different components of the electronic device 102 are discussed more detail later in this application.

The charging unit 104 may comprise a transmitting coil 112 for wireless charging, a power unit 114, indication means 116, and other charger related units 118. The other charger related units 118 of the charging unit 104 may comprise, e.g. a microcontroller and/or wireless communication means, e.g. one or more transmitters, one or more receivers, for wireless communication with other wireless devices, e.g. with the electronic device 102. The different components of the charging unit 104 are discussed more detail later in this application.

Figure 2:
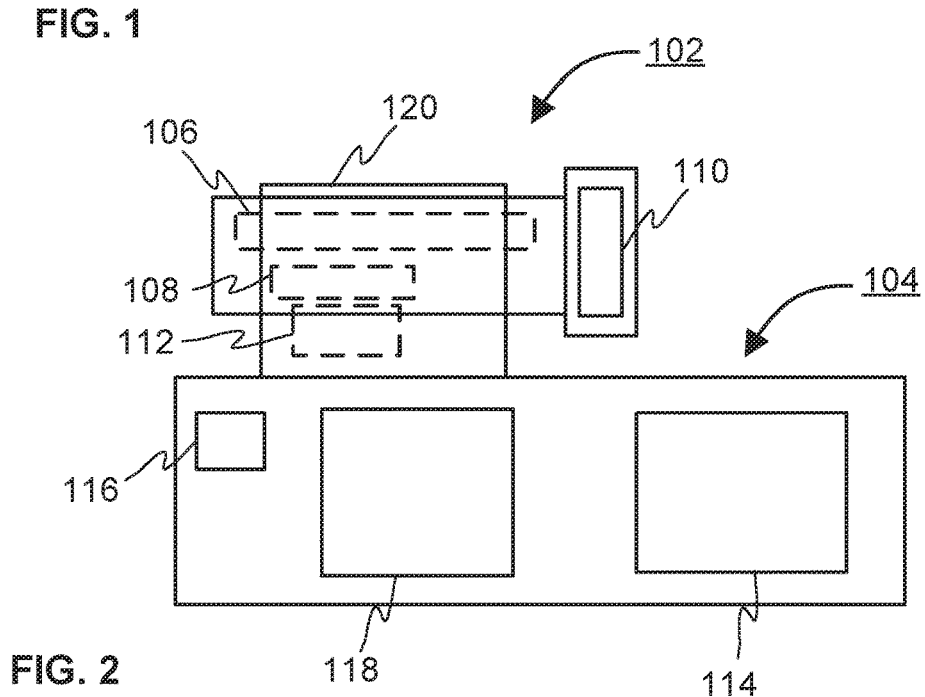
FIG. 2 illustrates schematically another example of a system according to the invention.

Charging of the electronic device 102 according to the invention is based on wireless charging. The wireless charging uses an electromagnetic field to transfer energy between two devices, such as electronic device 102 and charging unit 104, through electromagnetic induction. In the wireless charging the transmitting coil 112 of the charging unit 104 transmits electromagnetic power to the receiving coil 108 of the electronic device 102. The received electromagnetic power may be then be transformed and filtered into electric current to charge the battery of the electronic device 102. FIG. 2 illustrates an example of the system 100 according to the invention, wherein the electronic device 102 is arranged to the charging unit 104 in order to charge the battery of the electronic device 102. The charging unit 104 may comprise a receiving part 120 to which the electronic device 102 may be arranged to hold the electronic device 102 substantially stationary during the charging of the electronic device 102 as shown in the example system illustrated in FIGS. 1 and 2. Alternatively, the electronic device 102 may be arranged on top of the charger unit 104 having no receiving part for the electronic device 102.

The electronic device 102 according to the invention does not comprise any indication means to indicate information representing battery status of the electronic device 102. Thus, the user of the electronic device 102 is not able to see from the electronic device 102, e.g. when the charging is fully done, i.e. when the electronic device 102 may be disconnected from the charging unit 104.

In order to provide indication about the information representing the battery status of the electronic device 102 for the user of the electronic device 102 during the wireless charging process, the system 100 according to the invention uses the indication means of the charging unit 104. To provide the information representing the battery status to the charging unit 104, the electronic device 102 detects information representing the battery status of the electronic device 102. The detection may be provided by the microcontroller of the electronic device 102. The charging status of the battery may be detected by the voltage of the battery. For example, the microcontroller may monitor the voltage level by detecting the voltage of the battery by its input. Alternatively or in addition, the charging status may also be detected by charging current driven to the battery. For example, when the charging voltage is fixed, for example 4.2 volts, the driving current may indicate the charge level of the battery. For example, the charging current of 100 microamperes may indicate that the battery status is 10% or less, the charging current of 10 microamperes may indicate that the battery status is 90% or more. The charging status may also be detected as a combination of the voltage of the battery and the charging current. This is very applicable in the case when the battery is first charged by a constant voltage until the battery reaches 4.2 volts, and after that the battery is charged by a constant current. The detection may be provided continuously or at regular or irregular time intervals, e.g. every 1 minute or every 5 minutes. The electronic device 102 communicates, by means of the wireless communication means, the detected information representing the battery status to the charging unit 104. The charging unit 104 receives, by means of the wireless communication means, the information representing the battery status from the electronic device 102 and indicates, by means of the indication means 116, at least part of the received information representing the battery status of the electronic device 102. This allows that the user of the electronic device 102 may be aware of the battery status of the electronic device during the wireless charging, e.g. when the battery is fully charged and the device 102 may be disconnected from the charging unit 104.

According to one embodiment of the invention, the wireless communication between the electronic device 102 and the charging unit 104 may be optical communication. The wireless communication means of the electronic device 102 may comprise infrared (IR) transmitter and the wireless communication means of the charging unit 104 may comprise IR receiver in order to communicate the information representing the battery status from the electronic device 102 to the charging unit 104. The optical communication between the electronic device 102 and the charging unit 104 may be based on any known optical communication protocol, e.g. Universal asynchronous receiver transmitter (UART) protocol or Infrared Data Association (IrDA) protocol.

According to one embodiment of the invention, the IR transmitter of the electronic device 102 may be an infrared LED, IRLED. Preferably, the same IRLED may be used for optical sensing purposes of the electronic device 102, when the battery of the electronic device 102 is not charging. The optical sensing purposes of the electronic device 102 may be, e.g. skin color, optical plethysmography, optical blood analysis or optical heart rate. Alternatively, the electronic device 102 may comprise a first IR transmitter, e.g. IRLED, for communicating the information representing the battery status to the charging unit 104 and a second IR transmitter, e.g. IRLED, for optical sensing purposes.

The optical communication may be a simple on/off indication to the charging unit 104. For example, when the battery of the electronic device 103 is not full, the IRLED is off and when the battery is full the IRLED is set on. The microcontroller of the electronic device may be configured to detect the information representing the battery status of the electronic device 102. Furthermore, in response to detection of full charge of the battery, the microcontroller may be configured to set the IRLED on. Alternatively, in response to detection of not full charge of the battery, the microcontroller may be configured to set the IRLED off.

Alternatively, the optical communication may be based on pulsing of the IRLED. A continuous pulsing of the IRLED at one frequency, e.g. 38 kHz, may be used to indicate that the battery is fully charged, and no pulsing or pulsing at another frequency may be used to indicate that the battery is not fully charged. Alternatively, different pulsing frequencies may be used to indicate different charging levels of the battery, for example the charging levels may be percentage values of the charge of the battery or fractional levels of charging status. For example, 10 kHz may indicate that the battery has 10% of its capacity charged, 20 kHz may indicate that the battery has 40% of its capacity charged, 30 kHz may indicate that the battery has 70% of its capacity charged, and 40 kHz may indicate that the battery has 100% of its capacity charged. The above presented frequencies and percentage values of the charging capacity are only non-limiting examples and any other frequencies and/or percentage values may be used.

Alternatively or in addition, the information representing the battery status of the electronic device 102 may be coded to the pulsed data stream. For example, three 8 bits data sequences may be used for coding the information representing the battery status to be communicated to the charging unit 104. The charging unit 104, in turn, may be programmed to receive the coded signal from the electronic device 102, to analyze the code, and to indicate at least part of the information representing the battery status related to the received and analyzed code.

According to one embodiment of the invention, the wireless communication between the electronic device 102 and the charging unit 104 may be Bluetooth (BT) radio communication. In order to communicate the information representing the battery status from the electronic device 102 to the charging unit 104, the wireless communication means of the electronic device 102 may comprise BT radio communication unit or Bluetooth Low Energy (BTLE) radio communication unit and the wireless communication means of the charging unit 104 may comprise BT radio communication unit or BTLE radio communication unit, respectively. The BT radio communication between the electronic device 102 and the charging unit 104 may be based on any known BT or BTLE protocol.

The information representing the battery status may comprise at least one of the following: current charging status of the battery, estimation of required charging time for full charge. The current charging status may be fully charged or not fully charged as described above. Alternatively or in addition, the current charging status may be percentage value of the charge of the battery or fractional levels of charging status as described above.

The estimation of the required charging time for full charge of the battery may be based on a table or a formula for estimating required charging time. For example, the estimation may be based on the following simple formula: if the full charging requires 30 minutes, the 50% charging requires 15 minutes etc. Alternatively, the estimation may be based on historical charging data gathered from previous charging times of the electronic device 102. The estimation of the required charging time for full charge may be performed by the electronic device 102 or by the charging unit 104.

The charging unit 104 may further be able to recognize the electronic device 102 under wireless charging by one of the following: pairing or information based on the received information representing the battery status. The pairing may be based on any known pairing process, e.g. Bluetooth pairing process. The pairing process may be triggered automatically or manually by a user of the electronic device 102. The recognition of the electronic device 102 is required at least if the estimation of the required charging time for full charge is performed by the charging unit 104.

The indication means 116 of the charging unit 104 may comprise at least one of the following: one or more LED indicators, display, or any other indicator capable for indicating at least part of the information representing the battery status of the electronic device 102. According to one example, one LED indicator may be used to indicate whether the battery of the electronic device 102 is fully charged or not. For example, the microcontroller of the charging unit 104 may be configured to set the LED indicator on in response to receiving from the electronic device 102 information representing that the battery is fully charged and otherwise the LED indicator is set off. Alternatively, the microcontroller of the charging unit 104 may be arranged to set the LED indicator to emit, e.g. green color, in response to receiving from the electronic device 102 information representing that the battery is fully charged and otherwise the LED indicator may be arranged to emit another color, e.g. red color. Alternatively, different blinking frequencies of the LED indicator may be used indicate different charging levels of the battery, for example the charging levels may be percentage values or fractional levels of the charge of the battery. The blinking frequency, i.e. the frequency of the LED indicator switched on and off, may be set according the charging level of the battery. For example, 0.5 Hz blinking frequency may indicate that the battery has equal or less than 10% of its capacity charged, 1 Hz blinking frequency may indicate that the battery has 50% of its capacity charged, 2 Hz blinking frequency may indicate that the battery has 80% of its capacity charged, and continuous light or more than 20 Hz frequency may indicate that the battery is fully charged.

According to another example, a plurality of LED indicators may be used to indicate different charging levels of the battery, for example the charging levels may be percentage values or fractional levels of charge of the battery, e.g. ¼-½ or ¾ charged. For example, first LED indicator may indicate that the battery has 10% of its capacity charged, second LED indicator may indicate that the battery has 40% of its capacity charged, third LED indicator may indicate that the battery has 70% of its capacity charged, and fourth LED indicator may indicate that the battery has 100% of its capacity charged. Alternatively, the plurality of LED indicators may be used to indicate the estimated remaining charging time. For example, first LED indicator may indicate 30 minutes charging time and second LED indicator may indicate 15 minutes charging time, etc. The microcontroller of the charging unit 104 may be configured to set the LED indicators on/off in response to the received information representing the battery status from the electronic device 102.

The above presented colors of the LED indicator, blinking frequencies of the LED indicator, and the number or LED indicators are only non-limiting examples and any color, any blinking frequency, and any number of LED indicators may be used. Also, the above presented percentage values of the charging capacity and charging times are only non-limiting examples and any other percentage values and charging times may be used.

Similarly, the display or any other indicator may be used to indicate whether the battery of the electronic device 102 is fully charged or not, to indicate the percentage values of the charge of the battery, to indicate fractional levels of charged status, and/or to indicate remaining charging time of the battery.

Figure 3:
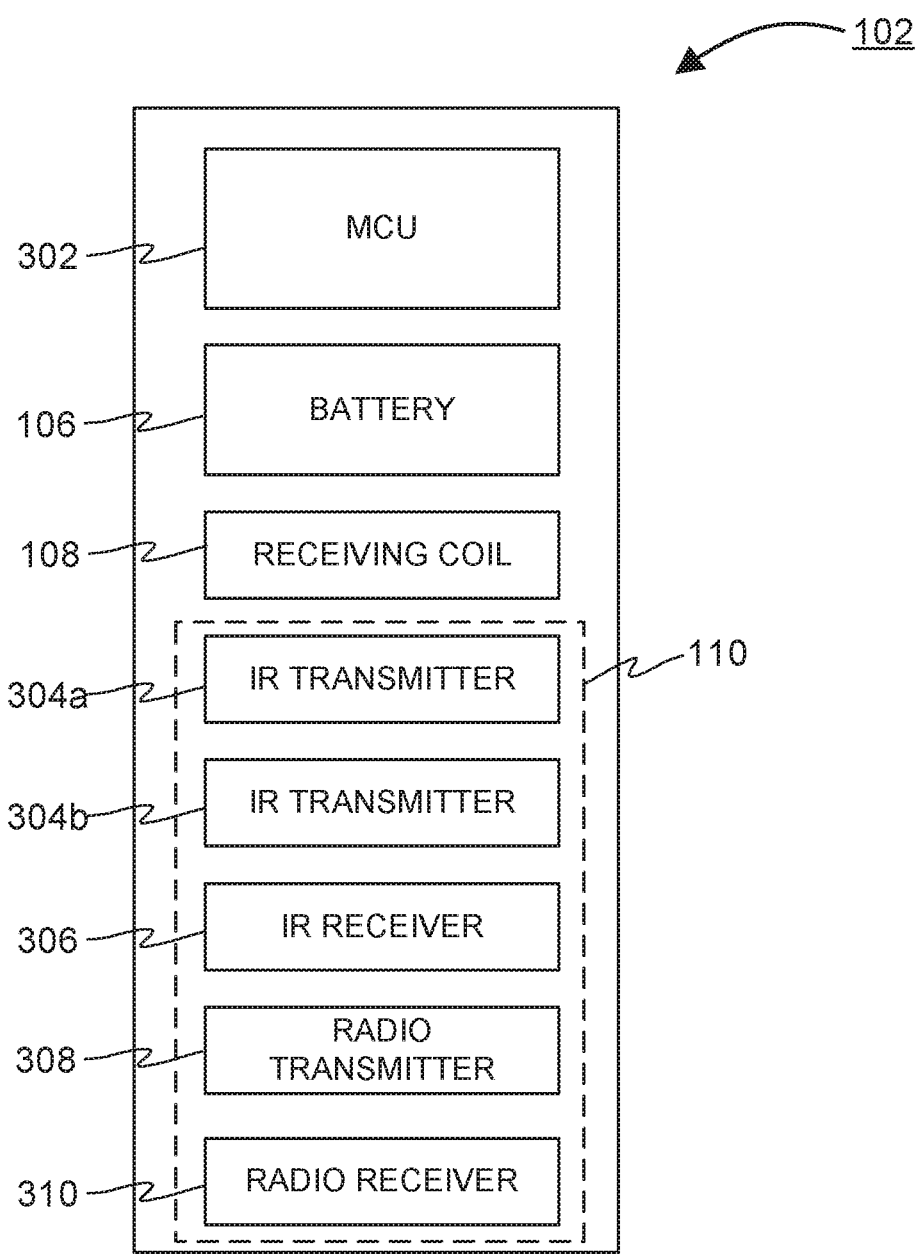
FIG. 3 illustrates schematically an example of an electronic device according to the invention.

FIG. 3 illustrates schematically an example of the electronic device 102 according to the invention. As discussed above, the electronic device 102 comprises the battery 106, the receiving coil 108 for wireless charging and other electronic device related units 110. The other device related units 110 may comprise a microcontroller 302, one or more IR transmitters 304a, 304b, IR receiver 306, and a wireless radio communication unit. The electronic device 102 may comprise one IR transmitter for wireless communication with the charging unit 104 and for optical sensing. Alternatively, the electronic device 102 may comprise separate IR transmitters for wireless communication with the charging unit 104 and for optical sensing. The wireless radio communication unit may comprise separate wireless radio transmitter 308 and wireless radio receiver 310 as illustrated in FIG. 3. Alternatively, the wireless radio communication unit may comprise a wireless radio transceiver. The wireless radio communication unit may be for example Bluetooth (BT) radio communication unit or Bluetooth Low Energy (BTLE) radio communication unit for BT radio communication with any other wireless devices, e.g. the charging unit 104. Furthermore, the electronic device 102 may comprise one or more sensors for different sensing purposes, e.g. body temperature; activity of a user; optical sensing for heart rate, oxygen level, or skin color etc. The mentioned elements may be communicatively coupled to each other.

The microcontroller 302 of the electronic device 102 may be configured at least to control the operations of the electronic device 102 described above, i.e. wireless charging, detection the information relating to the battery status of the electronic device 102, communication with the charging unit 104 through the communication means, and/or providing optical sensing. Furthermore, the microcontroller may be configured to control any other operations of the electronic device 102, e.g. any other sensing functions, communication with any other devices or units, e.g. mobile devices, such as mobile phones or tablet computers. Furthermore, the microcontroller 302 may comprise one or more memories being volatile or non-volatile for storing portions of computer program code and any information or parameters, e.g. information representing the battery status of the electronic device, information relating to the previous charging times of the electronic device 102 or sensing related information. The microcontroller 302 may be configured to control storing of received and delivered information.

Figure 4:
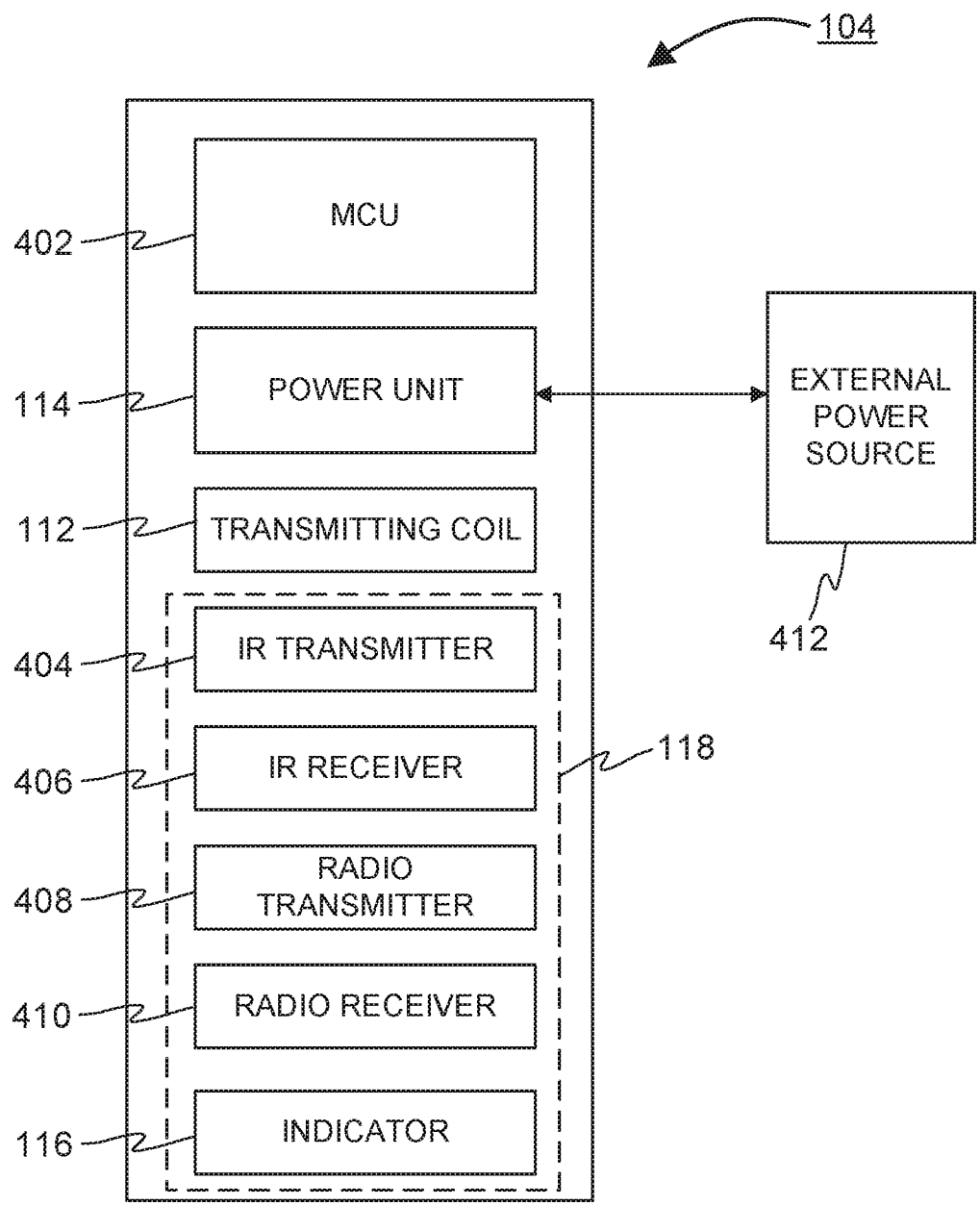
FIG. 4 illustrates schematically an example of a charging unit according to the invention.

FIG. 4 illustrates schematically an example of the charging unit 104 according to the invention. As discussed above, the charging unit 104 comprises the transmitting coil 112 for wireless charging, the power unit 114, the indication means 116, and other charger related units 118. The other charger related units 118 may comprise a microcontroller 402, IR transmitter 404, IR receiver 406, wireless radio communication unit. The wireless radio communication unit may comprise separate wireless radio transmitter 408 and wireless radio receiver 410 as illustrated in FIG. 4. Alternatively, the wireless radio communication unit may comprise a wireless radio transceiver. The wireless radio communication unit may be for example Bluetooth (BT) radio communication unit or Bluetooth Low Energy (BTLE) radio communication unit for BT radio communication with any other wireless devices, e.g. the electronic device 102. The mentioned elements may be communicatively coupled to each other. The charging unit 104 may comprise an interface to an external power source 412, e.g. mains (e.g. 230V, 110V or 100V) or low power source (12V or 5V), such as Universal Serial Bus (USB) charger; laptop; personal computer; portable power supply, e.g. powerbank; etc. The power unit 114 may comprise a transformer for transforming the voltage from the mains to the low voltage, e.g. 12V or 5V. Furthermore, the power unit 114 may comprise e.g. charging controller and wireless charger driver for wireless charging.

The microcontroller 402 of the charging unit 104 may be configured at least to control the operations of the charging unit 104 described above, i.e. wireless charging, communication with the electronic device 102 through the communication means, indication of at least part of the information representing the battery status of the electronic device 102, and/or recognition of the electronic device 102 under wireless charging. Furthermore, the microcontroller 402 may be configured to control any other operations of the charging unit 104, e.g. communication with any other devices or units, e.g. mobile devices, such as mobile phones or tablet computers. Furthermore, the microcontroller 402 may comprise one or more memories being volatile or non-volatile for storing portions of computer program code and any information or parameters, e.g. information relating to the previous charging times of the electronic device 102. The microcontroller 402 may be configured to control storing of received and delivered information.

Figure 5:
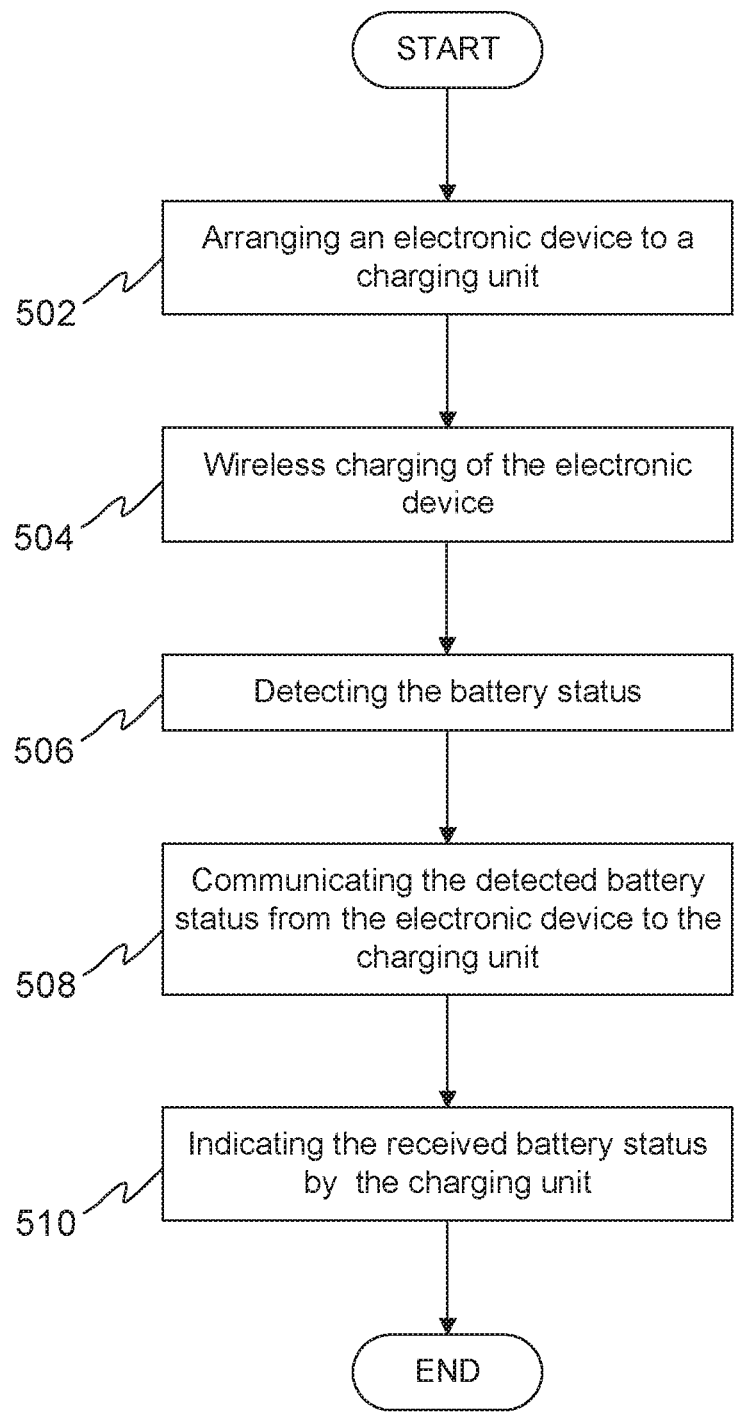
FIG. 5 illustrates schematically an example of a method according to the invention.

The invention is described above with respect to the system for indicating information representing battery status of an electronic device 102. Next an example of the method according to the invention is described by referring to FIG. 5. FIG. 5 schematically illustrates the invention as a flow chart. To start the wireless charging process the electronic device may be arranged 502 to the charging unit. The charging unit may be on continuously or the charging unit may be switched on when the electronic device is arranged to it. The switching on the charging unit may be provided manually by the user or automatically, i.e. the charging unit may automatically detect that the electronic device is arranged to it and in response to the detection of the electronic device the charging unit starts the wireless charging. As discussed above the charging unit transmits 504 power to the electronic device to charge the battery of the electronic device. During the wireless charging the electronic device detects 506 information representing the battery status of said electronic device as discussed above. The detection may be provided continuously or at regular or irregular time intervals, e.g. every 1 minute or every 5 minutes. The electronic device communicates 508 the detected information representing the battery status of the electronic device to the charging unit as discussed above. Furthermore, the indication means of the charging unit indicates 510 at least part of the received information representing the battery status of the electronic device as discussed above. The indication provided by the indicator of the charging unit allows that the user may be aware of the battery status of the electronic device during the wireless charging, e.g. when the battery is fully charged.

The specific examples provided in the description given above should not be construed as limiting the applicability and/or the interpretation of the appended claims. Lists and groups of examples provided in the description given above are not exhaustive unless otherwise explicitly stated.

The invention claimed is:

1. A system for indicating information representing battery status of an electronic device, the system comprising:
 a charging unit comprising:
  charging means for wireless charging;
  wireless communication means for communication with the electronic device; and
  indication means for indicating information representing the battery status of the electronic device;
 the electronic device without means for indicating information representing the battery status of said electronic device, the electronic device comprising:
  a rechargeable battery;
  charging means for wireless charging; and
  wireless communication means for communication with the charging unit;
 wherein, during the wireless charging of the electronic device:

the electronic device is configured to detect information representing the battery status of said electronic device and to communicate the detected information representing the battery status to the charging unit, and
  the charging unit is configured to receive the information representing the battery status from the electronic device and to indicate at least part of the received information representing the battery status of the electronic device,
 wherein the wireless communication means of the electronic device comprises an infrared, IR, transmitter and the wireless communication means of the charging unit comprises IR receiver in order to communicate the information representing the battery status from the electronic device to the charging unit,
 wherein the IR transmitter of the electronic device is an infrared LED, IRLED, used for optical sensing purposes, when the electronic device is not charging.

2. The system according to claim 1, wherein the electronic device is a wearable electronic device.

3. The system according to claim 1, wherein the indication means of the charging unit comprises at least one of the following: one or more LED indicators, display.

4. The system according to claim 1, wherein the information representing the battery status comprises at least one of the following: current charging status of the battery, estimation of required charging time for full charge.

5. The system according to claim 1, wherein the charging unit is further configured to recognize the electronic device under wireless charging by one of the following: pairing or information based on the received information representing the battery status.

6. A method for indicating information representing battery status of an electronic device, the method comprising:
 arranging the electronic device to a charging unit,
 wirelessly transmitting power from the charging unit to the electronic device in order to charge the battery of the electronic device,
 detecting information representing the battery status by the electronic device,
 communicating the detected information representing the battery status from the electronic device to the charging unit, and
 indicating the at least part of the received information representing the battery status by means of the indication means of the charging unit,
 wherein wireless communication means of the electronic device comprises an infrared, IR, transmitter and wireless communication means of the charging unit comprises IR receiver in order to communicate the information representing the battery status from the electronic device to the charging unit,
 wherein the IR transmitter of the electronic device is an infrared LED, IRLED, used for optical sensing purposes, when the electronic device is not charging.

* * * * *